United States Patent [19]

Desperben et al.

[11] Patent Number: 5,331,664

[45] Date of Patent: Jul. 19, 1994

[54] DEVICE FOR PROCESSING THE VITERBI ALGORITHM COMPRISING A PROCESSOR AND A DEDICATED OPERATOR

[75] Inventors: Lydie Desperben, Bois Colombes; Luc Dartois, Carrieres sous Poissy; Emmanuel Rousseau, Paris, all of France

[73] Assignee: Alcatel Radiotelephone, Paris, France

[21] Appl. No.: 791,410

[22] Filed: Nov. 14, 1991

[30] Foreign Application Priority Data

Nov. 15, 1990 [FR] France ............... 90 14230

[51] Int. Cl.$^5$ ............................... H04L 27/06
[52] U.S. Cl. ........................ 375/94; 371/43; 375/11; 375/101
[58] Field of Search ........... 375/39, 94, 11-14, 375/99, 101, 102; 371/43, 40.1, 41; 364/724.2

[56] References Cited

U.S. PATENT DOCUMENTS

| | | | |
|---|---|---|---|
| 4,583,078 | 4/1986 | Shenoy et al. | 371/43 |
| 4,675,871 | 6/1987 | Gordon et al. | 371/43 |
| 4,715,037 | 12/1987 | Yagi | 371/43 |

FOREIGN PATENT DOCUMENTS 0210932 2/1987 European Pat. Off. .... H03M 13/12

OTHER PUBLICATIONS

Telecommunications and Radio Engineering, vol. 43, No. 8, Aug. 1988, pp. 24-29, New York, US; V. L. Banket et al.: "Multiposition-signal convolution codecs and codems".

IEEE Transactions on Communications, vol. 38, No. 5, May 1990, pp. 578-583, New York, US; Zhenhua Xie et al.: "Multiuser signal detection using sequential decoding".

Primary Examiner—Stephen Chin
Assistant Examiner—Don N. Vo
Attorney, Agent, or Firm—Sughrue, Mion, Zinn, Macpeak & Seas

[57] ABSTRACT

A device for recovering an original bit stream from a received bit stream by processing the received bit stream in accordance with the Viterbi algorithm comprises an operator to establish the maximal metric of rank r of the state $E_j$ denoted $Met_r(E_j)$ for r greater than n and the (r-n)th bit of the bit stream corresponding to the metric from input values which are maximal metrics of rank $r-1$ of states $E_{2k}$ and $E_{2k+1}$ denoted $Met_{r-1}(E_{2k})$ and $Met_{r-1}(E_{2k+1})$ and the conditional probabilities related to the states $E_{2k}$, $E_{2k+1}$) that the r-th bit of the bit streams associated with these states has a determined value denoted $(Pr(b(r)+0/E_{2k})$ and $(Pr(b(r)=0/E_{2k+1})$ for example where k is equal to 2j for any value of j less than $2^{n-1}$ and has the value $2(j-2^{n-1})$ for any value of j greater than or equal to $2^{n-1}$, so that $Met_r(E_j)$ takes the larger of the values of the expressions $Met_r(E_j)+(Pr (b (r)=0/E_{2k})$ and $Met_{r-1}(E_{2k+1})+(Pr (b (r)=0/E_{2k+1})$.

12 Claims, 2 Drawing Sheets

DEVICE FOR PROCESSING THE VITERBI ALGORITHM COMPRISING A PROCESSOR AND A DEDICATED OPERATOR

BACKGROUND OF THE INVENTION

The present invention concerns a device comprising a processor designed in particular for processing the Viterbi algorithm.

The Viterbi algorithm is a known digital signal processing technique used in various fields in which it is necessary to estimate the value of the bits of a digital bit stream. These fields include convolutional decoding and equalization in digital demodulation.

The algorithm may be implemented by means of a generalized digital signal processor. This type processor is not specifically designed for processing this algorithm and to do so requires a very large number of instructions. The processing time, being dependent on the number of instructions to execute, is therefore long.

It is routine for additional processing to be needed in a signal processing circuit.

A first solution is to provide the signal processor with sufficient power to process the Viterbi algorithm and for such additional processing. Assuming that a processor with sufficient power were available, it would necessarily be relatively costly.

A second solution is to assign the processing of the Viterbi algorithm to a component designed specifically for this purpose, for example the FUJITSU MB 86620 Viterbi processor. In this case the signal processing circuit requires at least two components and it is therefore larger and more costly. Also, it does not lend itself well to miniaturization which is indispensible in some applications.

An object of the present invention is therefore a device designed in particular to process the Viterbi algorithm which does not use any dedicated component but a generalized signal processor for which the power needed for such processing has been reduced. This device is also designed to be integrated into a single component.

SUMMARY OF THE INVENTION

The device in accordance with the invention comprises a processor and is designed to process the Viterbi algorithm, the algorithm being defined by its constraint length of value $n+1$ and its $2^n$ states associated with streams of bits, the object of the processing being to estimate an original bit stream $b(i)$ produced from a transmitted bit stream by a transmission operation effected on the original bit stream. It further comprises an operator to establish the maximal metric of rank r of the state $E_j$ denoted $Met_r(E_j)$ for r greater than n and the (r-n)th bit of the bit stream corresponding to the metric from input values which are the maximal metrics of rank $r-1$ of states $E_{2k}$ and $E_{2k+1}$ denoted $Met_{r-1}(E_{2k})$ and $Met_{r-1}(E_{2k+1})$ and the conditional probabilities related to the states $E_{2k}$, $E_{2k+1}$ that the rth bit of the bit streams associated with these states has a determined valued denoted $(Pr(b(r)=O/E_{2k})$ and $(Pr(b(r)=O/E_{2k+1})$ for example where k is equal to 2j for any value of j less than $2^{n-1}$ and has the value $2(j-2^{n-1})$ for any value of j greater than or equal to $2^{n-1}$ so that $Met_r(E_j)$ takes the larger of the values of the expressions $Met_r(E_{2k})+(Pr(b(r)=O/E_{2k})$ and $Met_{r-1}(E_{2k+1})+(Pr(b(r)=O/E_{2k+1})$.

The operator therefore offloads from the processor certain operations which are carried out a very large number of times with relatively simple resources.

What is more, in the device for processing the Viterbi algorithm comprising a processor, the operator comprises additional means for establishing for any value of j less than $2^{n-1}$ from the input values not only the maximal metric of rank E of the state $E_j$ $Met_r(E_j)$ and the (r-n)th corresponding bit but also the maximal metric of rank r of the state $E_{j+a}$ $Met_r(E_{j+a})$ and the (r-n)th corresponding bit where a has the value $2^{n-1}$ whereby $Met_r(E_{j+a})$ takes the larger of the values of the formulae $Met_{r-1}(E_{2j})-(Pr(b(r)=O/E_{2j})$ and $Met_{r-1}(E_{2j+1})-(Pr(b(r)=O/E_{2j+1})$.

In a first embodiment of the device for processing the Viterbi algorithm comprising a processor, the operator being connected to the processor by at least one data bus and a control bus, it comprises four input registers whose inputs are each connected to one of the data buses, the first being adapted to receive the value of $Met_{r-1}(E_{2j})$, the second the value of $Pr(b(i)=O/E_{2j})$, the third the value of $Met_{r-1}(E_{2j+i})$ and the value of $Pr(b(i)=O/E_{2j+i})$, first and second calculator circuits adapted respectively to produce first and second results taking the value in response to a control signal of the sum or the difference of the respective contents of the first two input registers and the last two input registers, a comparator delivering an output signal of value 1 when the first result is less than the second result and of value 0 otherwise, a multiplexer controlled by the comparator producing as output signal that of the results which has the higher value, three output registers whose outputs are each connected to one of the data buses, the first and the second receiving the output signal of the multiplexer and being adapted to store the respective values of $Met_r(E)$ and $Met_r(E_{j+a})$, the third receiving the output signal of the comparator which is the (r-n)th bit of the bit streams corresponding to these metrics, and a control module adapted to control its various units according to information addressed by the processor on the control bus.

Moreover, in the device for processing the Viterbi algorithm comprising a processor, the third output register is also adapted to store the (r-n)th bit of all the bit streams corresponding to the $2^n$ maximal metrics of a given rank.

Also, in the device for processing the Viterbi algorithm comprising a processor, the processor comprising two data buses, the first and third input registers have their input connected to the first data bus, the second and fourth input registers have their input connected to the second data bus and the first and second output registers have their outputs each connected to a separate data bus.

Advantageously, in the device for processing the Viterbi algorithm comprising a processor, the operator comprises additional means for establishing the conditional probabilities related to the states $E_{2k}$, $E_{2k+1}$ that the rth bits of the bit streams associated with these states has a determined state according to the weightings of the bits of the bit stream transmitted related to the rth bits, to the number k associated with the states $E_{2k}$, $E_{2k+1}$ and to relationships defining the transmission operation.

Thus although the operator comprises more components it also relieves the processor of these calculations in order to reduce further the time it devotes to this processing.

In a second embodiment in the device for processing the Viterbi algorithm comprising a processor, the operator being connected to the processor by at least one data bus and a control bus, it comprises transfer registers whose inputs are each connected to one of the data buses, these transfer registers being each adapted to store one of the weightings, and a hardwired arithmetic unit connected to the outputs of the transfer registers having access to the value j identifying a state and establishing the relationships defining the transmission operation to produce the conditional probabilities, four input registers of which the first whose input is connected to one of the data buses is adapted to receive the value of $Met_{r-1}(E_{2j})$, the second storing the value of $Pr(b(r)=O/E_{2j})$ supplied by the arithmetic unit, the third whose input is connected to one of the data buses being adapted to receive the value of $Met_{r-1}(E_{2j+1})$ and the fourth storing the value of $(Pr(b(r)=O/E_{2j+1})$ supplied by the arithmetic unit, first and second calculator circuits adapted respectively to produce first and second results taking the value in response to a control signal of the sum or the difference of the respective contents of the first two input registers and the last two input registers, a comparator supplying an output signal of value 1 when the first result is less than the second result and of value 0 otherwise, and a multiplexer controlled by the comparator producing by way of output signal that of the results which has the greater value, three output registers whose outputs are each connected to one of the data buses, the first and the second receiving the output signal of the multiplexer and being adapted to store respectively the values of $Met_r(E)$ and $Met_r(E_{j+a})$, the third receiving the output signal of the comparator which is the (r-n)th bit of the bit streams corresponding to these metrics, and a control module adapted to control its different units according to information addressed by the processor on the control bus.

Moreover, in the device for processing the Viterbi algorithm comprising a processor, the third output register is also adapted to store the (r-n)th bit of all the bit streams corresponding to the $2^n$ maximal metrics of a given rank.

Furthermore, in the device for processing the Viterbi algorithm comprising a processor, the processor comprising two data buses, the transfer registers have their inputs divided between the first and second data buses, the first and the third input registers having their inputs each connected to a separate data bus and the first and second output registers having their outputs each connected to a separate data bus.

Whichever embodiment is employed, there may be provision in the device for processing the Viterbi algorithm comprising a processor whereby some units of the operator are incorporated in the processor.

A first application of the device for processing the Viterbi algorithm comprising a processor consists in, the transmission operation being convolutional encoding, decoding of the transmitted bit stream.

A second application of the device for processing the Viterbi algorithm comprising a processor consists in, the transmission operation introducing intersymbol interference into the transmitted bit stream, equalization of the bit stream.

BRIEF DESCRIPTION OF THE DRAWINGS

The various objects and features of the present invention will emerge more clearly from the following description of embodiments of the invention given by way of non-limiting example with reference to the appended drawings in which.

Elements common to both figures carry the same reference symbols.

DESCRIPTION OF THE PREFERRED EMBODIMENTS

Figure 1:
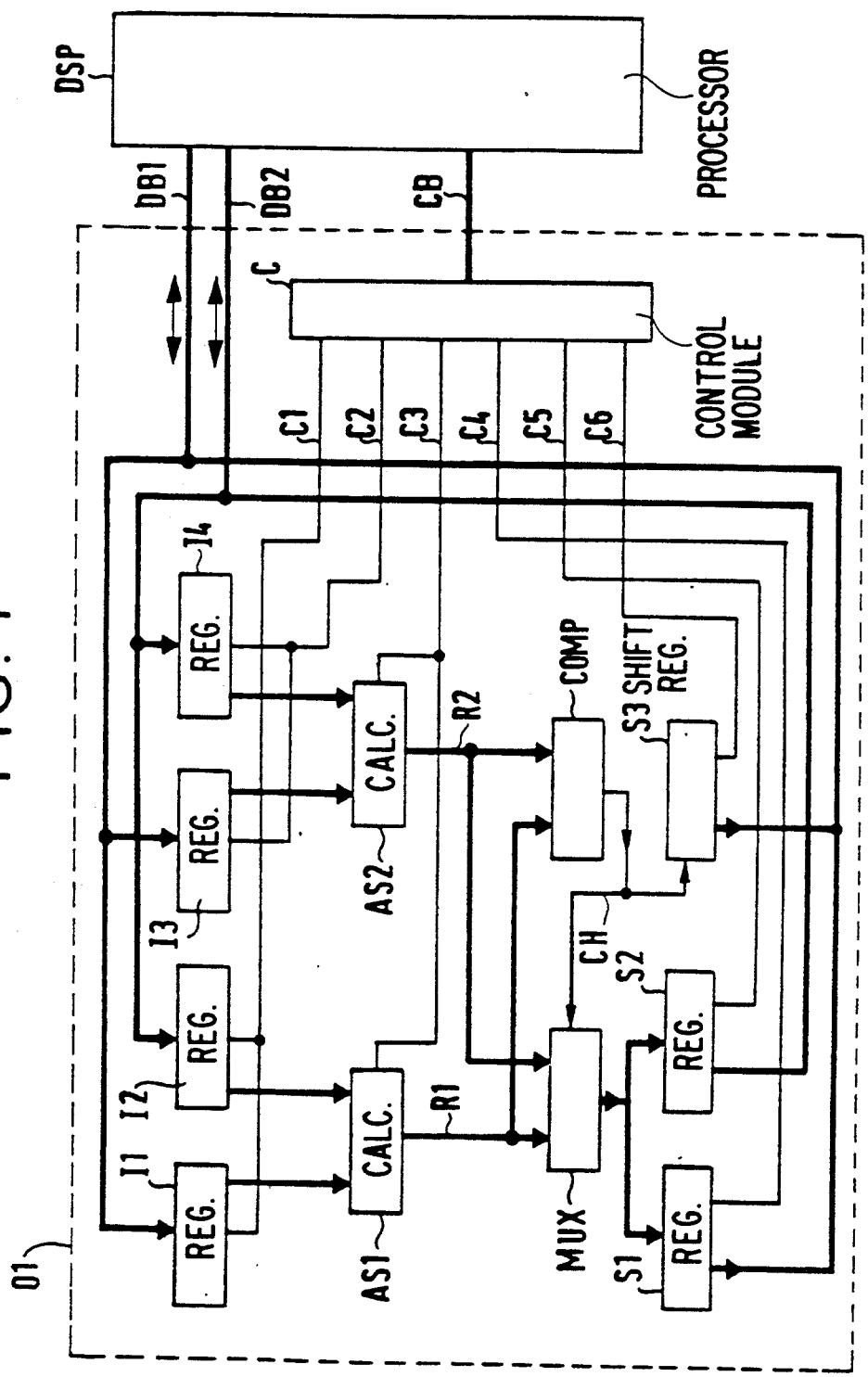
FIG. 1 shows a block diagram of a first embodiment of the invention.

The Viterbi algorithm provides a solution to the problem of estimating an original bit stream from a transmitted bit stream. The transmitted bit stream is obtained after modification of the original bit stream by a transmission medium, by encoding or by any other means whose effect is known. The generic term "transmission operation" will be used to refer to such modifications. The estimation is based on calculating for each original bit stream the probability that it produced the transmitted bit stream. The solution original bit stream is that with the highest probability.

The Viterbi algorithm will now be described in order to introduce the magnitudes which are processed in the context of the invention.

The input magnitudes are:

The set of $L_t$ probabilities characterizing the transmitted bit stream of length $L_t$, each of these probabilities characterizing the value of one bit of the transmitted bit stream BT (i) where i takes all values between 1 and $L_t$.

The parameters characterizing the environment in which the transmission operation is effected.

To standardize the calculations the concept of weighting is used in the algorithm. The weighting is defined relative to the bit value probability as shown by the following formula:

Weight (BT (i))=[2.Probability (BT (i)=1)−1].Weightmax −[1−2.Probability $(BT (i)=0)$].Weightmax At the input we therefore have the series of $L_t$ weightings in corresponding relationship to the $L_t$ bit value probabilities of the transmitted bit stream, each of these weightings being able to vary between weightmax and -weightmax. The parameters characterizing the environment in which the transmission operation is effected make it possible to define the relationship that exists between the bits of the original bit stream and the bits of the transmitted bit stream. They therefore make it possible to define any redundancy introduced by the transmission operation. It is therefore assumed that the length of the transmitted bit stream $L_t$ verifies the condition:

$L_t$=L.T, where L is the length of the original bit stream and T is the order of redundancy.

To be more precise, these parameters define the relationships between a bit BT(i) of the transmitted bit stream and the n+1 bits b(i) of the original bit stream from which it is descended. There are therefore T relationships which can be expressed in the form:

(BT (i.T)=$F_1$[b (i), b (i−1), b(i−n)]

(BT (i.T+1)=$F_2$[b (i), b (i−1), b(i−n)]

(BT (i.T+T−1)=$F_T$[b (i), b (i−1), b(i−n)]

For example:

1/T convolutional encoding introduces redundancy of order T and defines T relationships between the bits transmitted and those to be transmitted, the transmission of a digital signal on channels affected by intersymbol interference does not introduce any redundancy and defines only a single relationship ($T=1$ and therefore $L_t=L$). The input magnitudes make it possible to obtain at the output of the Viterbi algorithm the bit stream of L bits with the maximum probability of being the original bit stream from which the transmitted bit stream is descended.

Direct application of the maximum probability rule would make it necessary to calculate for a bit stream of length L the $2^L$ probabilities for the $2^L$ possible bit streams, which would require a considerable period of time given the order of magnitude of L. The Viterbi algorithm solves this problem by very significantly reducing the number of probability calculations. This is achieved by the progressive (bit by bit) estimation of the most probable bit streams by using the relationships between each bit transmitted and the corresponding $n+1$ bits to be transmitted to calculate the bit stream probabilities.

From these T relationships T new relationships are defined which in turn define T expressions of the probability that the bit $b(i)$ of the original bit stream is equal to X, a binary symbol, knowing its n antecedent bits and the weighting of the bits transmitted:

$$Pr_1(b(i) = X) = G_1[\text{Weight}(BT(i \cdot T), X, b(i-1), \ldots, b(i-n)]$$
$$Pr_2(b(i) = X) = G_2[\text{Weight}(BT(i \cdot T + 1), X, b(i-1), \ldots, b(i-n)]$$

$$\vdots$$

$$Pr_T(b(i) = x) = G_T[\text{Weight}(BT(i \cdot T + T - 1), X, b(i-1), \ldots, b(i-n)]$$

It is difficult to provide a general description of the transition from the functions $F_m$ to the functions $G_m$ ($m=1$ to T) as these relationships depend exclusively on the transmission operation. Nevertheless, knowing the functions $F_m$ and the weighting of the bits transmitted implies the functions $G_m$.

Concrete examples are described hereinafter.

The functions $G_m$ define an expression of the value probabilities of $b(i)$ which satisfies:

$$Pr_m(b(i)=X) = [2.\text{Proba}(b(i)=X-1)] \cdot \text{Gmax}$$
$$= [1-2.\text{Proba}(b(i)=1-X)] \cdot \text{Gmax}$$

thus: $Pr_m(\text{bit}(i)=X) = -Pr_m(\text{bit}(i)=1-X)$

An expression for the total probability of the value of $b(i)$ is then defined by:

$$Pr(b(i) = X) = (1/T) \cdot \sum_{m=1}^{T} Pr_m(b(i) = X)$$

This expression therefore represents the conditional value probability of $b(i)$ given the n antecedent bits of $b(i)$. The notation used is: $Pr(b(i)=X/n)$.

The metric of the bit stream to be estimated formed by the L binary symbols $X_i$ is then defined by:

$$\text{Met (stream)} = (1/T) \cdot \sum_{i=1}^{L} Pr(b(i) = X_i/n) \quad (1)$$

For the first n bits of the original bit stream:

These bits form a digital sub-stream of the stream to be estimated of length n. The $2^n$ metrics of the $2^n$ possible bit streams are then calculated from formula (1).

For the next bit:

There are $2^{n+1}$ possible bit streams. This number is reduced to the $2^n$ most probable bit streams by eliminating erroneous bit streams using the maximum resemblance criterion of these bit streams, therefore of the highest metric, using the calculations of the preceding metrics by recurrence.

The bit stream of $n+1$ bits which has the greatest metric is then chosen from the following two binary bit streams in which the bits $bi(i=2$ to $n+1)$ are fixed:
S0: 0, $b_2, b_3, \ldots, b_n, b_{n+1}$
S1: 1, $b_2, b_3, \ldots, b_n, b_{n+1}$ To make this choice it is necessary to calculate the two metrics of the two bit streams S0 and S1, Met (S0) and Met (S1) using the following recurrence formula:

$$\text{Met (S0)} = \text{Met } (0, b_2, b_3, \ldots, b_n) + Pr(\text{bit}(n+1) = b_{n+1}/n)$$

$$\text{Met (S1)} = \text{Met } (1, b_2, b_3, \ldots, b_n) + Pr(\text{bit}(n+1) = b_{n+1}/n)$$

The metrics to the right of the equals sign are known from the preceding calculations. It therefore remains to calculate $Pr(b(n+1) = b_{n+1}/n)$ which represents an expression of the conditional probability of $b_{n+1}$ given the value of the n preceding bits.

The maximal metric bit stream is the held in memory with its associated metric and the choice of the first bit of the maximal metric bit stream.

There are $2^n$ pairs of possible bit streams S0 and S1. This process is therefore carried out $2^n$ times and it is therefore seen that the $2^n$ metrics in corresponding relationship to the $2^n$ most probable bit streams from the $2^{n+1}$ bit streams proposed have been calculated by making choices on the value of the first bit in each of these bit streams.

These choices correspond to the maximum probability of resemblance of the first bit in the bit streams. The values of the first bits of the $2^n$ preselected bit streams formed of $n+1$ bits have therefore been set.

For the subsequent bits

For the next bit (which corresponds to the $n+2$nd) the same process is carried out as described in the previous paragraph to estimate the $2^n$ most probable bit streams from the $2^n$+bit streams formed from the $n+2$ first bits.

In all there are $2^{n+1}$ possible bit streams formed by the $n+2$ first bits because an allowance is made for the choices of the first bit on these bit streams made previously. There are therefore only $n+1$ variable bits on these bit streams and therefore $2^{n+1}$ possible combinations.

The $2^n$ most probable bit streams are estimated among the $2^{n+1}$ proposed by setting the second bit of the $2^{n+1}$ possible bit streams:

The bit stream of $n+2$ bits which has the higher metric is chosen from the two following binary bit streams in which the bits $bi(i=3$ to $n+2)$ and the bits $B1_{s0}$ and $B1_{s1}$ which are the first bits previously chosen are fixed:

S0': $B1_{s0}, 0, b_3, \ldots, b_{n+1}, b_{n+2}$
S1': $B1_{s1}, 0, b_3, \ldots, b_{n+1}, b_{n+2}$ The two metrics of the two bit streams S0' and Si', Met (S0') and Met (S1') are then calculated using the following recurrence formula with the two bit streams S0''$_1$, S1''$_1$ characterizing the n antecedent bits and with the conditional probabilities tied to these bit streams:

S0'': $0, b_3, \ldots, b_{n+1}$
S1'': $1, b_3, \ldots, b_{n+1}$ $$Met\ (S0') = Met\ (B1_{s0}, 0, b_3, \ldots, b_{n+1}) + Pr\ (b(n+2) = b_{n+2}/S0'')$$

$$Met\ (S1') = Met\ (B1_{s1}, 0, b_3, \ldots, b_{n+1}) + Pr\ (b(n+2) = b_{n+2}/S1'')$$

The metrics to the right of the equals sign are known from the preceding calculations. It remains only to calculate the conditional probabilities.

The maximal metric bit stream is therefore held in memory together with its associated metric and the choice of the first bit of the maximal metric bit stream.

This process is therefore carried out $2^n$ times for the $2^n$ possible bit streams S0' and S1' and, as previously, the $2^n$ most probable bit streams are calculated from the $2^{n+1}$ proposed by making choices on the value of the second bit of the $2^{n+1}$ bit streams, these choices corresponding to the maximal resemblance probability of the bit in the bit stream.

For the subsequent bits (of rank $n+3$ through L), the same process is used to choose the $2^n$ most probable bit streams by choosing, one after the other, the L-n first bits of the $2^n$ suites according to the maximal resemblance of the latter.

At the end of the algorithm the solution bit stream is chosen as that which corresponds to that having the greatest resemblance, that is to say the greatest metric, of the $2^n$ bit streams proposed.

Variables to be used hereinafter will now be defined.

The constraint length is equal to $n+1$ and defines the number of consecutive bits to be transmitted linked by relationships representing the transmission operation.

A state of the algorithm defines a possible bit stream of length 1 greater than n having only its last n bits variable. Each state $E_j$ therefore characterizes one possible bit stream $S_j$ of n bits and can be represented by the number j:

$$S_j : b_{1-n+1}, b_{1-n+2}, \ldots, b_1$$

$$j = \sum_{i=0}^{n-1} b_{1-i} \cdot 2^{n-1-i}$$

In a more general formulation of the Viterbi algorithm, it is a matter of choosing one of the two bit streams $S0_j$, $S1_j$ in which the bits $BS0_j(i)$ and $BS1_j(i)$ ($i=1$ to $r-n-1$) have been fixed by the preceding stages and in which r represents a rank:

$S0_j$:$BS0_j(1), BS0_j(2), \ldots, BS0_j(r-n-1), 0, b_{r-n+1} \ldots, b_{r-1}, b_r$ $S1_j$:$BS1_j(1), BS1_j(2), \ldots, BS1_j(r-n-1), 1, b_{r-n+1} \ldots, b_{r-1}, b_r$ These two binary bit streams of length r correspond to the same state $E_j$ as they have the same last n bits; by convention, the associated metrics are said to be of rank r and denoted $Met_r$.

Then for each j ($j=0 \ldots 2^n-1$), the two metrics of rank r $Met_r(S0_j)$ and $Met_r(S1_j)$ of the two bits streams $S0_j$ and $S1_j$ are calculated and the more probable bit stream is chosen as that which has the greater metric:

$$Met_r(S0_j) \text{ and } Met_{r=1}(S0'_j) + Pr\ (b(r) = b_r/S0''_j)$$

$$Met_r(S1_j) \text{ and } Met_{r=1}(S1'_j) + Pr\ (b(r) = b_r/S1''_j)$$

with:

(S0'$_j$): $BS0_j(1), BS0_j(2) \ldots BS0_j(r-n-1), 0, b_{r-n+1} \ldots b_{r-1}$ (S1'$_j$): $BS1_j(1), BS1_j(2) \ldots BS1_j(r-n-1), 1, b_{r-n+1} \ldots b_{r-1}$ (S0''$_j$): $0, b_{r-n+1}) \ldots b_{r-1}$ (S1''$_j$): $1, b_{r-n+1}) \ldots b_{r-1}$ Using the previously given definition of a state of a bit stream and introducing the number $c = b_r 2^n$, it is seen that the bit streams S0'$_j$ and S1'$_j$ respectively correspond to the states $E_{2j-c}$ and $E_{2j+1-c}$ of the bit streams adopted during the previous stage whose last bits respectively form the bit streams S0''$_j$ and S1''$_j$.

It is then possible to define a new formulation equivalent to the previous one by replacing the identification of a bit stream by the state associated with it in which $Met_r(S0_j)$ and $Met_r(S1_j)$ are respectively denoted $Met0_r(E_j)$ and $Met1_r E_j$:

$$Met0_r\ (E_j) = Met_{r-1}\ (E_{2j-c}) + Pr\ (b(r) = b_r/E_{2j-c})$$

$$Met1_r\ (E_j) = Met_{r-1}\ (E_{2j+1-c}) + Pr\ (b(r) = b_r/E_{2j+1-c})$$

The maximal metric of rank E of the state $E_j$ of the bit stream is then defined by the following relationship in which MAX [A,B] represents the greater of the two values A, B:

$$Met_r(E_j) = MAX\ [Met1_r(E_2), Met0_r(E_j)\ ]$$

The (r-n)th bit of the $2^n$ solution bit streams are chosen according to the maximal metric.

It is therefore seen that the process amounts to calculating the $2^n$ maximal metrics of rank r of states $E_j$ ($j=0, \ldots, 2^n-1$) of the $2^n$ bit streams of r bits that are the most probable from the $2^n$ maximal metrics of rank $r-1$ of the $2^n$ states of the bit streams of $r-1$ bits that are the most probable calculated previously.

Consider now two particular states $E_j$, $E_{j+a}$ for j less than $2^{n-1}$ which correspond to two bit streams differing only in their last bit, that is to say when $a = 2^{n-1}$:

$$E_j = b_{r-n+1}, b_{r-n+2}, \ldots, b_{r-2}, b_{r-1}, 0$$

$$E_{j+1} = b_{r-n+1}, b_{r-n+2}, \ldots, B_{r-2}, b_{r-1}, 1$$

For the metrics associated with the state $E_j$, the number c previously defined has a null value because its last bit $b_r$ has a null value. It is therefore possible to reformulate the metrics of rank r associated with the state $E_j$:

$$Met0_r\ (E_j) = Met_{r-1}\ (E_{2j}) + Pr\ (b(r) = 0/E_{2j})$$

$$Met1_r\ (E_j) = Met_{r-1}\ (E_{2j+1}) + Pr\ (b(r) = 0/E_{2j+1})$$

For the metrics associated with the state $E_{j+a}$, the value of the number c previously defined is $2^n$ because its last bit $b_r$ has the value 1. Because $P_r(b(r)=1/E_j)$ and $P_r(b(r)=O/E_j)$ have the same absolute value and opposite signs, the metrics of rank r associated with the state $E_{j+a}$ can be reformulated:

$$c = 2a$$

$$2(j+a) - c = 2j$$

$$2(j+a) + 1 - c = 2j + 1$$

$$\text{Met0}_r(E_{j+a}) = \text{Met}_{r-1}(E_{2j}) + Pr(b(r) = O/E_{2j})$$

$$\text{Met1}_r(E_{j+a}) = \text{Met}_{r-1}(E_{2j+1}) + Pr(b(r) = O/E_{2j+1})$$

It follows that the maximal metrics of rank r associated with the states $E_j$, $E_{j+a}$ can be calculated by means of the maximal metrics of rank $r-1$ associated with the states $E_{2j}$, $E_{2j+1}$ and conditional probability expressions for the rth bit $b(r)$ relative to these last two states.

The invention proposes a solution for effecting these calculations by employing in a device a dedicated operator interfaced to a digital signal processor. It applies a fortiori if only the maximal metric of rank r associated with the state $E_j$ is calculated, subject to a limited number of modifications that will be obvious to the man skilled in the art.

The processing of the Viterbi algorithm can be broken down into three phases: an initial phase, a recurrent phase and a final phase.

The first phase consists in establishing the maximal metrics of rank n $\text{Met}_n(E_j)$ Using a known technique, these metrics are calculated from n known guard bits transmitted before the original bit stream. If no guard bits are provided, these metrics are calculated directly from the weighting of the bits transmitted instead of using the conditional probabilities of the bits of the original bit stream.

The recurrence phase to which the invention more particularly applies will be described later. This phase requires the greatest number of operations and therefore takes the longest time.

The final phase consists in defining the most probable original bit stream from the maximal metrics of rank L calculated during the preceding phase. Like the initial phase, it is familiar to the man skilled in the art.

The recurrence phase will now be described. It consists in establishing the maximal metrics of rank L from the maximal metrics of rank n.

It may be implemented in the form of a first loop in which the index i of the bits $b(i)$ of the original bit stream takes all values from $n+1$ through L, this first loop incorporating a second loop in which it is the index j associated with the states $E_j$ of the algorithm which is incremented to take all values between 0 and $2^{n-1}$.

The value $ch(i,j)$ of the (i-n)th bit of the jth bit stream associated with the state $E_j$ takes the value 1 if $\text{Met1}_i(E_j)$ is greater than $\text{Met0}_i(E_j)$ and the value 0 otherwise.

Loop 1: for $i = n+1$ through L do:
initialization
Loop 2: for $j = 0$ through $2^{n-1} - 1$ do:
$\text{Met0}_i(E_j) = \text{Met}_{i-i}(E_{2j}) + Pr(b(i) = O/E_{2j})$
$\text{Met1}_i(E_j) = \text{Met}_{i-1}(E_{2j+1}) + Pr(b(i) = O/E_{2j+1})$
$\text{Met}_i(E_j) = \text{MAX}[\text{Met1}_i(E_j), \text{Met0}_i(E_j)]$
ch $(i,j) = (i-n)$th bit of the jth bit stream corresponding to $\text{Met}_i(E_j)$ $\text{Met0}_i(E_{j+a}) = \text{Met}_{i-i}(E_{2j}) + Pr(b(i) = O/E_{2j})$
$\text{Met1}_i(E_{j+a}) = \text{Met}_{i-1}(E_{2j+1}) + Pr(b(i) = O/E_{2j+1})$
$\text{Met}_i(E_{j+a}) = \text{MAX}[\text{Met1}_i(E_j), \text{Met0}_i(E_j)]$
ch $(i, j+a) = (i-n)$th bit of the $(j+a)$th bit stream corresponding to $\text{Met}_i(E_{j+a})$
End loop 2.
Update.
End loop 1

The "initialization" and "update" stages are indicated for information only. They are familiar to the man skilled in the art and provide in particular for optimizing the memory associated with the processor.

In a first embodiment of the invention the operator performs all the operations of the second loop apart from calculating the conditional probabilities which is done by the processor.

The operator receives as input for each iteration of the second loop:

$\text{Met}_{i-1}(E_{2j})$ $Pr(b(i) = O/E_{2j})$ $\text{Met}_{i-1}(E_{2j+1})$ $Pr(b(i) = O/E_{2j+1})$ The operator supplies as output for each iteration of the second loop:
$\text{Met}_i(E_j)$
$\text{Met}_i(E_{j+a})$ The operator supplies as output for each iteration of the first loop:
$ch(i,j)$ for $j = 0$ through $2n - 1$ It may be assumed that the operator has no need to know the value of j by assuming that j is initialized to outside the second loop during the initialization stage of the first loop, the value of j being incremented automatically on each iteration of the loop.

It is further assumed that the values of the (i-n)th bits of the various bit streams will be read outside the second loop in the update stage of the first loop.

The processor has a "HARVARD" type architecture, by which is meant a parallel multibus architecture. It therefore has a plurality of data buses enabling it to conduct a plurality of data transfers in parallel.

It is assumed in this example that the processor has at least two data buses for parallel transfer of two independent data items.

The invention applies also if the processor has a single data bus, subject to a limited number of modifications that will be obvious to the man skilled in the art. The processing time would then be increased.

Operator control may be implemented via the processor address bus by providing for decoding of information present on this bus. It may also be implemented via the processor instruction bus, and this offers greater flexibility. Whichever solution is adopted, reference will be made to a control bus of the processor enabling control of the operator.

The processing of the Viterbi algorithm will now be described with reference to a specific circuit shown in FIG. 1. This circuit is shown by way of example and numerous other embodiments are possible without departing from the scope of the invention.

The operator 01 is connected to the processor DSP by two data buses DB1, DB2 and a control bus CB. It comprises four input registers of which the first I1 and third I3 have their input connected to the first data bus DB1 and the second I2 and fourth I4 have their input connected to the second data bus DB2. It comprises a first calculator circuit AS1 producing on command a first result R1 of adding or subtracting data present in the first and second input registers I1 and I2. It also comprises a second calculator circuit AS2 producing on command a second result R2 of adding or subtracting data present in the third and fourth input registers I3 and I4. The operator 01 further comprises a comparator COMP which produces a choice signal CH at 1 when the second result R2 is greater than the first R1 and at 0 otherwise. It also comprises a multiplexer MUX which produces by way of output signal M the first or second result R1 or R2 according to whether the choice signal value is respectively 0 or 1. It comprises three output registers of which the first S1 and second S2 receive as input the output signal M of the multiplexer while the third S3 is a shift register storing the various values taken in succession by the choice signal CH. The first and third output registers S1 and S3 have their output connected to the first data bus DB1 and the second output register S2 has its output connected to the second data bus DB2. The operator 01 finally comprises a control module C which produces signals controlling the various units of the operator in response to information present on the control bus CB. These signals are:

a first control signal C1 to the first and second input registers I1 and I2, a second control signal C2 to the third and fourth input registers I3 and I4, a third control signal C3 for setting the two calculator circuits AS1, AS2 to add or subtract mode, a fourth control signal C4 to the first output register S1, a fifth control signal C5 to the second output register S2, a sixth control signal C6 to the third output register S3.

The control module C which would usually comprise a simple combinatorial logic circuit will not be described in detail because its function will be obvious to the man skilled in the art given the succession of operations carried out by the device described hereinafter.

The discussion of the Viterbi algorithm started above may now be completed by specifying the role of the operator and the processor.

Loop 2

Calculation of the value of Pr $(b(i)=O/E_{2j})$ by the processor DSP,

Calculation of the value of $Pr(b(i)=O/E_{2j+1})$ by the processor,

Transfer of the value of $Met_{i-1}(E_{2j})$ and the value of $Pr(b(i)=O/E_{2j})$ from the processor to the operator O1, Transfer of the value of $Met_{i-1}(E_{2j})$ and the value of $Pr(b(i)=O/E_{2j+1})$ from the processor to operator O1, Calculation of $Met_i(E)$, calculation and storage of the (i-n)th bit CH of the jth bit stream by the operator, Calculation of $Met_i(E_{j+a})$, calculation of storage of the (i-n)th bit CH of the (j+a)th bit stream by the operator, Transfer of the value of $Met_i(E)$ and $Met_i(E_{j+a})$ from the operator to the processor.

End loop 2.

Transfer of $2^n$ values of the (i-n)th bits of the bit streams from the operator to the processor.

It is necessary to optimize the number of instruction cycles taken by the second loop to carry out the operations described above. It is difficult to give an exact estimate of the number of cycles because this depends on the type of processor interfaced to the operator and of the intended application of the Viterbi algorithm. Nevertheless, the following hypotheses will be adopted:

Calculating the conditional probabilities takes only one processor instruction cycle and is carried out within the second loop.

The processor can carry out one operation and two data transfers in a single instruction cycle.

In this case, the seven stages of the second loop are done in five processor instruction cycles using parallel processing between the operator and the processor, this technique being known to the man skilled in the art as "pipelining". These two units work simultaneously for two consecutive values of $j:j_o$ et $j_o+1$, in relation with the corresponding two states of the algorithm $E_{2j_o}$, $E_{2j_o+2}$.

During the first cycle the processor DSP transfers the values of $Met_{i-1}(E_{2j_o})$ and $Pr(b(i)=O/E_{2j_o})$ calculated previously over the respective data buses DB1, DB2 to the first and second input registers I1 and I2 respectively by means of the first control signal C1.

During the second cycle the processor DSP transfers the value of $Met_{i-1}(E_{2j_o+1})$ and $Pr(b(i)=O/E_{2j_o+1})$ calculated previously over the respective data buses DB1, DB2 to the third and fourth input registers I3 and I4 respectively by means of the second control signal.

During the third cycle the processor DSP calculates the value of $Pr(b(i)=O/E_{2j_o+2})$ and the operator O1 calculates the value of $Met_i(E_{j_o})$ by setting the two calculator circuits AS1, AS2 to add mode by means of the third control signal C3, stores this value in the first output register $S_1$ by means of the fourth control signal C4 and stores the (i-n)th corresponding bit CH in the third output register S3 by means of the sixth control signal C6.

During the fourth cycle the processor DSP calculates the value of $Pr(b(i)=O/E_{2j_o+3})$ and the operator O1 calculates the value of $Met_i(E_{j_o+a})$ in subtract mode by means of the third control signal C3, stores this value in the second output register S2 by means of the fifth control signal C5 and stores the (i-n)th corresponding bit CH in the third output register S3 by means of the sixth control signal C6.

During the fifth cycle the processor DSP acquires the values of $Met_i(E_{j_o})$ and $Met_i(E_{j_o+a})$ via the two data buses DB1, DB2.

At the end of $2^{n-1}$ iterations of the second loop, the operator O1 transfers the various values of the (i-n)th bits to the processor DSP over the first data bus DB1 using the sixth control signal C6.

It appears necessary to provide for additional initialization of the conditional probability values for jo=0. This stage does not represent any difficulty for the man skilled in the art.

It is also implicit that the operator is able to carry out the processing required in the third and fourth cycles in a time period comparable with that of the cycles.

It is therefore seen that the total number N1 of cycles to execute the two interleaved loops is, if E1 denotes the number of cycles external to the second loop included in the first loop:

$$N1 = (L-n)(2^{n-1}.5 + E1)$$

If N2 denotes the total number of cycles needed in the case of a single signal processor calculating a single maximal metric from two lower rank metrics and E2 denotes the number of cycles external to the second loop included in the first loop, this number has the value:

$$N2 = (L-n) \cdot (2^n \cdot 8 + E2)$$

As E1 and E2 are usually less than ten and n is usually between 4 and 7, it follows that N1 is substantially three times smaller than N2.

In a second embodiment of the invention the operator effects all the operations of the second loop which means that in addition to the operations described with reference to the previous embodiment it calculates the conditional probabilities.

The operator receives as input for each iteration of the second loop:

Weight (BT(I)) for $I = i.T, i.T+1, \ldots, i.T+T-1$ $Met_{i-1}(E_{2j})$ $Met_{i-1}(E_{2j+1})$ The operator supplies as output for each iteration of the second loop:

$Met_i(E_j)$ $Met_i(E_{j+a})$

The operator supplies as output for each iteration of the first loop:

$ch(i,j)$ for $j = 0$ through $2^{n-1}$

As previously, it is assumed that j is initialized to 0 outside the second loop in the initialization stage of the first loop, the value of j being incremented automatically on each iteration of the loop. Also, the operator does not need to have the weightings of the bits transmitted on each iteration of the second loop, a single transmission being enough. It is therefore assumed that these values are transferred to the operator outside the second loop but inside the first loop, when values are initialized.

As previously, it is assumed that the values of the (i-n)th bits of the various bit streams will be read outside the second loop within the first loop during the update stage.

Figure 2:
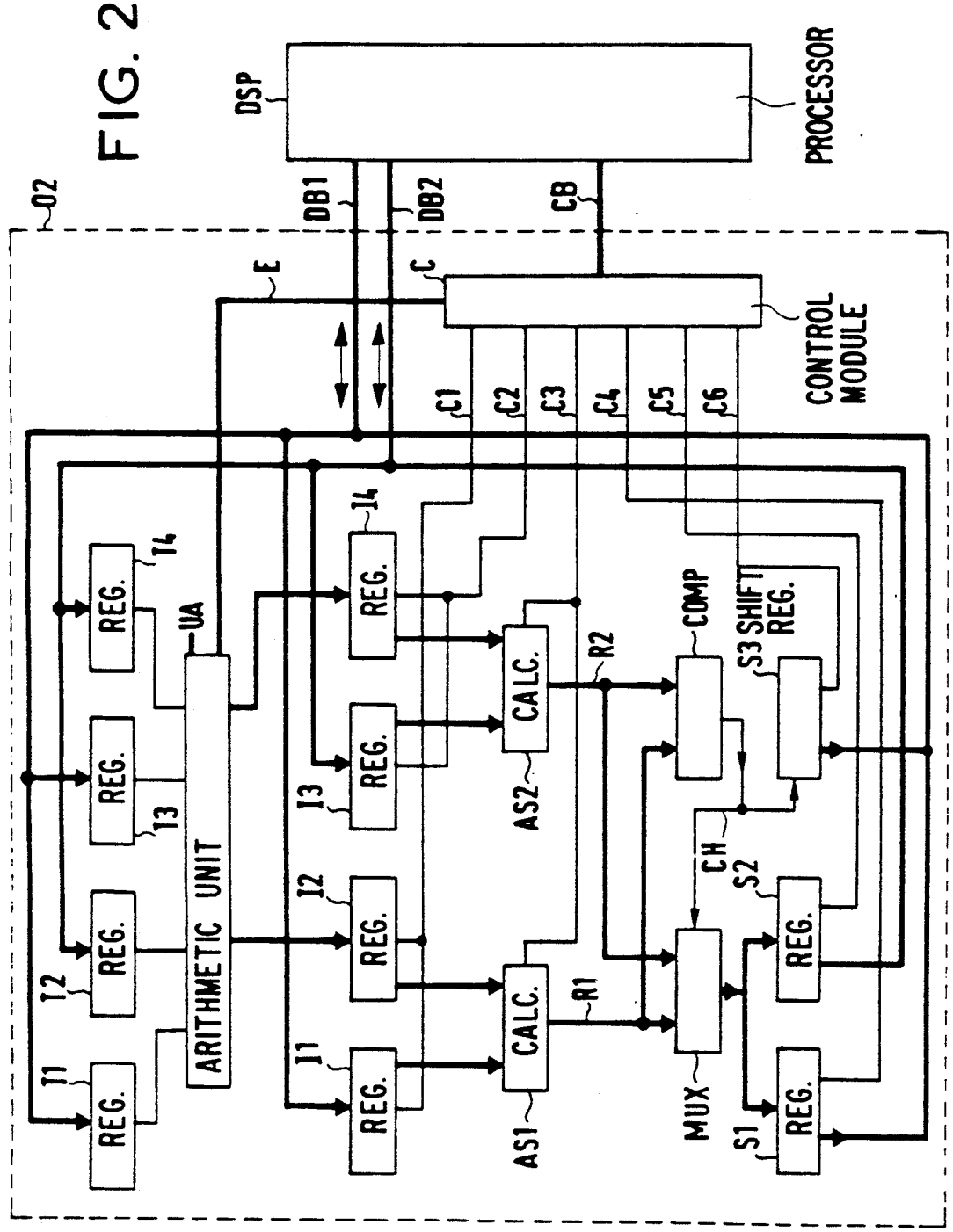
FIG. 2 shows a block diagram of a second embodiment of the invention.

The processing of the Viterbi algorithm will now be described with reference to another circuit shown in FIG. 2, the processor being identical to that used in the first embodiment.

In the example chosen, T is set equal to 4, which makes the description clearer. This must not be seen as restricting the invention which applies whatever the value of T subject to a limited number of minor modifications that will be obvious to the man skilled in the art.

The operator O2 is distinguished from that O1 described previously in the following respects. It comprises four transfer registers of which the first T1 and the third T3 have their input connected to the first data bus DB1 and the second T2 and the fourth T4 have their input connected to the second data bus DB2. It also comprises an arithmetic unit UA which calculates the conditional probability expressions from the output signals of the four transfer registers provided for storing Weight (BT(i.4)), Weight (BT(i.4+1)), Weight (BT(i.4+2)) and Weight (BT(i.4+3)).

This arithmetic unit is a hardwired circuit which raises no problems of implementation.

The second input register I2 receives the value of $Pr(b(i)=O/E_{2j})$ not via the second data bus DB2 but directly from the arithmetic unit UA. Likewise, the fourth input register I4 now receives the value of $Pr(b(i)=O/E_{2j+1})$ directly from the arithmetic unit UA.

Additional control signals are further provided for controlling the transfer registers and the arithmetic unit. These signals having a function similar to that described with reference to the first embodiment, they will not be described in more detail and are not shown in the figure. Also provided is a status signal E which transmits the value of j corresponding to the number of iterations of the second loop of the control module C to the arithmetic unit UA.

The treatment of the Viterbi algorithm given above may now be completed by specifying the role of the operator and the processor.

Loop 1: for $i = n+1$ through L do
initialization including the transfer of Weight (BT(i.4)), Weight (BT(i.4+1)), Weight (BT(i.4+2)) and Weight (BT(i.4+3)) from the processor DSP to the four transfer registers T1, T2, T3, T4, Loop 2: for $j = 0$ through $2^{n-1}-1$ do
calculate value of $Pr(b(i)=O/E_{2j})$ by operator O2,
calculate value of $Pr(b(i)=O/E_{2j+1})$ by operator O2,
Transfer $Met_{i-1}(E_{2j})$ from processor DSP to operator,
Transfer $Met_{i-1}(E_{2j+1})$ from processor DSP to operator,
Calculate $Met_i(E_j)$, calculate and store (i-n)th bit of the jth bit stream by operator,
Calculate $Met_i(Ej+a)$, calculate and store (i-n)th bit of the (j+a)th bit stream by operator,
Transfer values of $Met_i(Ej)$ and $Met_i(Ej+a)$ from operator to processor,
End loop 2.
Transfer $2^n$ values of (i-n)th bits of bit streams from operator to processor and update.
End loop 1.

The same hypotheses apply as in the previous embodiment:

The calculation of the conditional probabilities would take only one instruction cycle of the processor DSP if it were effected in the latter.

The processor DSP can effect one operation and two data transfers in a single instruction cycle.

In this case, the seven stages of the second loop are done in two instruction cycles of the processor with parallel processing between the processor and the operator.

These two units operate simultaneously for two consecutive values of j : $j_o$ and $j_o+1$, in relation with the corresponding two states of the algorithm $E_{2j_o}, E_{2j_o+2}$.

During the first cycle the processor DSP transfers the value of $Met_{i-1}(E_{2j_o+2})$ and the value of $Met_{i-1}(E_{2j_o+3})$ respectively into the first and third input registers I1 and I3 and the operator O2 calculates the values of $Met_i(E_{j_o})$ and $Met_i(E_{j_o+a})$, stores them and stores the (i-n)th corresponding bits CH as in the previous embodiment.

During the second cycle the processor DSP acquires the values of $Met_i(E_{j_o})$ and $Met(E_{j_o+a})$ and the operator O2 calculates the values of $Pr(b(i)=O/E_{2j_o+2})$ and $Pr(b(i)=O/E_{2j_o+3})$ in the arithmetic unit UA to supply them respectively to the second and fourth input registers I2 and I4.

After $2^{n-1}$ iterations of the second loop the operator O2 transfers the various values of the (i-n)th bits to the processor DSP.

It appears that it is necessary to provide additional initialization of the values of conditional probability for jo=0. This stage does not present any problem to the man skilled in the art.

It is also implicit that the operator can carry out the processing provided for in the two instruction cycles each in a time compatible with that of a cycle.

It is therefore seen that the total number N3 of cycles to effect the two interleaved loops takes the value:

$$N3 = (L-n).(2^{n-1}.2 + E3)$$

where E3 denotes the number of cycles external to the second loop included in the first loop.

If N4 denotes the total number of cycles needed in the case of a single signal processor calculating a single maximal metric from two lower rank metrics and E4 denotes the number of cycles external to the second loop included in the first loop, the value of this number is:

$$N4 = (L-n).(2^n.8 + E4)$$

It may be assumed that N3 is slightly greater than N4 but the two values are small in comparison with $2^n$. The orders of magnitude given in the context of the first embodiment remaining valid, it follows that N3 is substantially eight times larger than N4.

Thus of the two embodiments described the second offers better performance in terms of processing speed but requires a hardwired arithmetic unit to calculate the conditional probability expressions. Its implementation depends on the transmission context and it is therefore not very flexible. If the same operator is required to enable more than one use of the Viterbi algorithm it must have more than one arithmetic unit each capable of calculating the conditional probability expressions associated with one use of the algorithm. This therefore increases the size of the operator.

On the other hand, the first embodiment allows different uses of the algorithm without modification. The only thing in the algorithm that changes from one use to another is the definition of the conditional probability expressions that are calculated by the processor.

The two embodiments offer different performance at different cost and the choice of one or the other will depend on the required specifications.

The operators of the invention can be implemented in two different ways, either totally external to the processor to which they are interfaced or partially incorporated in the processor.

In the first case the operator is independent of the processor.

In the second case some registers of the operator can be replaced with registers in the processor data arithmetic and logic unit. The surface area occupied by the operator is therefore reduced accordingly.

The first case applies whether the operator and the processor are in the same component or not whereas the second case is only feasible in a solution in which the processor and the operator are integrated into a common component.

The structure of the invention having been described, some applications of the invention in the field of transmission will now be described.

The two most common uses of the Viterbi algorithm for digital signal processing are decoding convolutional codes and equalization during demodulation of signals affected by intersymbol interference.

In the context of decoding a convolutional code, processing the Viterbi algorithm requires:
the weightings of the value probabilities of the bits of the transmitted bit stream,
the relationship representing the transmission operation.

It is usual in signal processing to carry out decoding after demodulation. It is the demodulator which supplies the weightings. The relationship representing the transmission operation is convolutional encoding which relates a coded bit BC to (n+1) bits b of the original bit stream by means of the following relationships:

$$BC(T \cdot k) = b(k) \oplus a_{11} \cdot b(k-1) \oplus, \ldots, \oplus a_{n1} \cdot b(k-n)$$
$$BC(T \cdot k + 1) = b(k) \oplus a_{12} \cdot b(k-1) \oplus, \ldots, \oplus a_{n2} \cdot b(k-n)$$
$$\vdots$$
$$BC(T \cdot k + T - 1) = b(k) \oplus a_{1T} \cdot b(k-1) \oplus, \ldots, \oplus a_{nT} \cdot b(k-n)$$

where:
$\oplus$ represents an "exclusive-OR" logic operator, and
k=1, ..., L where L is equal to the number of bits of the original bit stream,
$a_{ij}$=0 or 1 according to the coding chosen.

The weightings Weight $(BT(i)=B(i))$, i=1, ..., T.L, which correspond to the value probabilities of the transmitted bits are known. By effecting variable inversion between b(i) and BC(T.i), by replacing in the previous expression the encoded bits BC(I) with the corresponding weightings Weight (BT(I)), and by normalizing the expressions, the following T expressions are obtained:

$$Pr_1(b(k) = X/n) = \text{Weight } (BT(T \cdot k)) \cdot N[X \oplus a_{11} \cdot b(k-1) \oplus, \ldots, \oplus a_{n1} \cdot b(k-n)]$$
$$Pr_2(b(k) = X/n) = \text{Weight } (BT(T \cdot k + 1)) \cdot N[X \oplus a_{12} \cdot b(k-1) \oplus, \ldots, \oplus a_{n2} \cdot b(k-n)]$$
$$\vdots$$
$$Pr_T(b(k) = X/n) = \text{Weight } (BT(T \cdot k + T - 1)) \cdot N[X \oplus a_{1T} \cdot b(k-1) \oplus, \ldots, \oplus a_{nT} \cdot b(k-n)]$$

where:
X is a binary symbol,
N [bit] is a normalizing function defined by:
N [bit]=1 if bit=1, −1 if bit=0.

These T expressions therefore correspond to the conditional probabilities of the bit b(k) being equal to X knowing the value of the n antecedent bits. All these terms are combined into a single term to obtain an expression corresponding to the total conditional probability:

$$Pr(b(k) = X/E_j) = \sum_{i=1}^{T} Pr(b(k) = X/n)$$

where $E_j$ is the state defined by the n antecedent bits.

This expression therefore defines the expression of the total conditional probability corresponding to that used in the invention.

In the context of equalization during demodulation of signals affected by intersymbol interference, processing the Viterbi algorithm requires:

the weightings expressions of value probabilities of bits of the transmitted bit stream, the relation representing the transmission operation.

It is usual in signal processing to carry out equalization after filtering matched to the impulse response of the transmission channel. It is the matched filter which supplies the weightings.

The relationship representing the transmission operation is that which characterizes a digital signal modulated in a channel affected by intersymbol interference. This relationship does not introduce any redundancy (T=1) and relates each bit to be transmitted to the n preceding bits of the original bit stream.

This relationship is expressed directly by the following formulation which defines an expression of the conditional value probability of the ith bit of the original bit stream knowing its n antecedents which define the state $E_j$ and the weighting of the ith bit transmitted:

$$Pr(b(i) = 0/E_j) = -\text{Weight}(BT(i)) + \sum_{k=1}^{n-1} U(i-k) \cdot S(k)$$

where $U(k) = 2 \cdot b(k) - 1$, $S(k) =$ kth intersymbol interference coefficient.

The second operand of the righthand member of the equation represents what might be termed the interference term of the n antecedent bits of the bit b(i). The terms $U(i-k)$ (for k=1 through n−1) represent the n antecedent bits of the bit b(i) and the terms $S(k)$ are intersymbol interference coefficients associated with the antecedent bits $b(i-k)$.

These intersymbol interference coefficients are constant during the transmission of a bit stream of L bits. They generate $2^n$ interference terms corresponding to the $2^n$ possible states $E_j$. These $2^n$ terms are therefore calculated outside the first loop. The calculation of a conditional probability is then reduced to the addition of a weighting and an interference term.

We claim:

1. A device for recovering an original bit stream b(i) from a received bit stream by processing said received bit stream in accordance with a Viterbi algorithm, said device comprising a processor, said Viterbi algorithm being defined by a constraint length of value n+1 and $2^n$ states associated with streams of bits, characterized in that said device comprises an operator (C, COMP, MUX, S1, S3) coupled to said processor for processing said Viterbi algorithm with said processor for establishing a maximal metric of rank r of a state $E_j$ denoted $Met_r(E_j)$, for r greater than n, where r and n are integers, and the (r-n)th bit of the received bit stream corresponding to said maximal metric from input values which are maximal metrics of rank r-1 of states $E_{2k}$ and $E_{2k+1}$ denoted $Met_{r-1}(E_{2k})$ and $Met_{r-1}(E_{2k+1})$ and the conditional probabilities related to said states $E_{2k}$ and $E_{2k+1}$ that the r-th bit of bit streams associated with these states has a determined valued denoted $Pr(b(r)=O/E_{2k})$ and $Pr(b(r)=O/E_{2k+1})$, where k is equal to 2j for any value of j, j being an integer, less than $2^{n-1}$, and has the value $2(j-2^{n-1})$ for any value of j greater than or equal to $2^{n-1}$, so that $Met_r(E_j)$ takes the larger of the values of the expressions $Met_{r-1}(E_{2k})+Pr(b(r)=O/E_{2k})$ and $Met_{r-1}(E_{2k+1})+Pr(b(r)=O/E_{2k+1})$.

2. The device according to claim 1, characterized in that said operator comprises additional means (AS1, AS2, S2) for establishing for any value of j less than $2^{n-1}$ from said input values, not only the maximal metric of rank r of the state $E_j$ $Met_r(E_j)$ and the (r-n)th corresponding bit, but also the maximal metric of rank r of the state $E_{j+a}$ $Met_r(E_{j+a})$ and the (r-n)th corresponding bit, where a has the value $2^{n-1}$, whereby $Met_r(E_{j+a})$ takes the larger of the values of the formulae $Met_{r-1}(E_{2j}) - (Pr(b(r)=O/E_{2j}))$ and $Met_{r-1}(E_{2j+1}) - Pr(b(r)=O/E_{2j+1})$.

3. The device according to claim 2, characterized in that said operator is connected to said processor (DSP) by at least one data bus (DB1, DB2) and a control bus (CB), said operator (O1) comprises four input registers whose inputs are each connected to one of said at least one data bus, the first input register (I1) receiving the value of $Met_{r-1}(E_{2j})$, the second input register (I2) receiving the value of $Pr(b(i)=O/E_{2j})$, the third input register (I3) receiving the value of $Met_{r-1}(E_{2j+1})$ and the fourth input register (I4) receiving the value of $Pr(b(i)=O/E_{2j+1})$, first and second calculator circuits (AS1, AS2) adapted respectively to produce first and second results (R1,R2) taking the value, in response to a control signal (C3), of the sum or the difference of the respective contents of the first two input registers (I1,I2) and the last two input registers (I3,I4), a comparator (COMP) delivering an output signal (CH) of value 1 when said first result (R1) is less than said second result (R2) and of value 0 otherwise, a multiplexer (MUX) controlled by said comparator producing as an output signal (M) that of said results which has the higher value, first, second and third output registers whose outputs are each connected to one of said at least one data bus, the first output register (S1) and the second output register (S2) receiving the output signal (M) of said multiplexer and storing the respective values of $Met_r(E_j)$ and $Met_r(E_{j+a})$, the third output register (S3) receiving the output signal (CH) of said comparator which is the (r-n)th bit of bit streams corresponding to said maximal metrics, and a control module (C) for producing said control signal (C3) and adapted to control various units of said operator according to information addressed by said processor (DSP) on said control bus (CB).

4. The device according to claim 3, characterized in that said third output register (S3) also stores the (r-n)th bit of all the bit streams corresponding to $2^n$ maximal metrics of a given rank.

5. The device according to claim 3, characterized in that said processor (DSP) comprises two data buses, inputs of said first (I1) and third (I3) input registers being connected to the first data bus (DB1), inputs of said second and fourth input registers (I2, I4) being connected to the second data bus (DB2), and outputs of said first and second output registers (S1, S2) each being connected to a separate data bus.

6. The device according to claim 2, characterized in that said operator comprises additional means (UA) for establishing said conditional probabilities related to the states $E_{2k}$, $E_{2k+1}$ such that the r-th bits of the bit streams associated with said states $E_{2k}$, $E_{2k+1}$ have states determined according to weightings of the bits of bit stream transmitted from said processor related to said r-th bits, to the number k associated with said states $E_{2k}$, $E_{2k+1}$, and to relationships defining a transmission operation.

7. The device according to claim 6, characterized in that said operator is connected to said processor by said at least one data bus (DB1, DB2) and a control bus (CB), said operator (O2) comprises transfer registers (T1,T2,T3,T4) whose inputs are each connected to said at least one data bus, said transfer registers each storing one of said weightings, and a hardwired arithmetic unit connected to the outputs of said transfer registers having access to the value j identifying a state and establishing relationships defining a transmission operation to produce said conditional probabilities, four input registers of which the first (I1) has an input connected to one of said data buses to receive the value of $MET_{r-1}(E_{2j})$, the second (I2) stores the value of $Pr(b(r)=O/E_{2j})$ supplied by said hardwired arithmetic unit, first and second calculator circuits (As1,AS2) for respectively producing first and second results (R1,R2) taking the value, in response to a control signal (C3), of the sum or the difference of the respective contents of the first two input registers (I1, I2) and the last two input registers (I3,I4), a comparator (COMP) supplying an output signal (CH) of value 1 when said first result (R1) is less than said second result and of value 0 otherwise, and a multiplexer (MUX) controlled by said comparator producing as an output signal (M) that of said results which has the greater value, three output registers whose outputs are each connected to said at least one data bus, the first and the second output registers (S1, S2) receiving the output signal (M) of said multiplexer and storing respectively the values of $Met_r(E_j)$ and $Met_r(E_{j+a})$, the third output register (S2) receiving the output signal (CH) of said comparator which is the (r-n)th bit of the bit streams corresponding to said maximal metrics, and a control module (C) for producing said control signal (C3) and adapted to control different units of said operator according to information addressed by said processor (DSP) on said control bus (CB).

8. The device according to claim 7, characterized in that said third output register (S3) is also adapted to store the (r-n)th bit of all bit streams corresponding to the $2^n$ maximal metrics of a given rank.

9. The device according to claim 7, characterized in that said processor (DSP) comprises two data buses, said transfer registers have inputs divided between the first and second data buses (DB1, DB2), the first and the third input registers (I1, I3) having inputs each connected to a separate data bus, and said first and second output registers (S1, S2) have outputs each connected to a separate data bus.

10. The device according to claim 1, characterized in that predetermined portions of said operator are incorporated in said processor (DSP).

11. The device according to claim 1, wherein said received bit stream is an encoded bit stream resulting from convolutional encoding of said original bit stream, said device enabling decoding of said received bit stream.

12. The device according to claim 1, wherein said received bit stream includes intersymbol interference, said device enabling equalization of said received bit stream.

* * * * *